United States Patent
Seta et al.

(10) Patent No.: US 8,653,629 B2
(45) Date of Patent: Feb. 18, 2014

(54) SEMICONDUCTOR DEVICE AND WAFER

(75) Inventors: Shoji Seta, Tokyo (JP); Yojiro Hamasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 13/236,353

(22) Filed: Sep. 19, 2011

(65) Prior Publication Data

US 2012/0242402 A1 Sep. 27, 2012

(30) Foreign Application Priority Data

Mar. 25, 2011 (JP) ................................. 2011-068712

(51) Int. Cl.
*H01L 23/544* (2006.01)
(52) U.S. Cl.
USPC ............. 257/620; 257/48; 257/203; 257/204; 257/207; 257/691; 257/758; 257/759; 257/309; 438/14; 438/15; 438/33; 438/68; 438/113; 438/462
(58) Field of Classification Search
USPC .................................. 257/678, 758, 773, 774
See application file for complete search history.

(56) References Cited

U.S. PATENT DOCUMENTS

| 5,739,546 | A | 4/1998 | Saitou et al. |
| 2004/0017279 | A1 | 1/2004 | Kamoshima |
| 2008/0230874 | A1* | 9/2008 | Yamada et al. ............... 257/620 |
| 2011/0186838 | A1* | 8/2011 | Pagani ............................ 257/48 |
| 2012/0018726 | A1 | 1/2012 | Nakagawa et al. |

FOREIGN PATENT DOCUMENTS

| JP | 05-052900 | 3/1993 |
| JP | 07-169807 A | 7/1995 |
| JP | 2002-208618 | 7/2002 |
| JP | 2003-007781 | 1/2003 |
| JP | 2004-063619 A | 2/2004 |
| JP | 2006-041236 A | 2/2006 |
| WO | WO 2010/110233 A1 | 9/2010 |

OTHER PUBLICATIONS

Office Action (with English translation) for Japanese Patent Application No. 2011-068712, mailed Jul. 5, 2013, 3 pgs.

* cited by examiner

*Primary Examiner* — Steven Loke
*Assistant Examiner* — Cuong B Nguyen
(74) *Attorney, Agent, or Firm* — Sprinkle IP Law Group

(57) ABSTRACT

A semiconductor device has a semiconductor substrate. The semiconductor device has a plurality of LSI regions that are formed on the semiconductor substrate and are provided with a first power supply wiring layer including a first power supply wire. The semiconductor device has a first power supply terminal formed on the semiconductor substrate. The semiconductor device has a second power supply wiring layer including a second power supply wire that electrically connects the first power supply wire and the first power supply terminal, the second power supply wiring layer is formed in a dicing region between the LSI regions along a dicing line that separates the LSI regions and the dicing line region. A first barrier metal film is formed at least in the LSI regions at a boundary between the first power supply wire and the second power supply wire.

9 Claims, 13 Drawing Sheets

SEMICONDUCTOR DEVICE AND WAFER

CROSS-REFERENCE TO RELATED APPLICATION

This application is based upon and claims the benefit of priority from the prior Japanese Patent Application No. 2011-068712, filed on Mar. 25, 2011, the entire contents of which are incorporated herein by reference.

BACKGROUND

1. Field

Embodiments described herein relate generally to a semiconductor storage device comprising resistance change elements.

2. Background Art

Nowadays, in order to reduce the manufacturing cost of large scale integration (LSI) products, the die sort test is performed on a basis of a set of a plurality of LSI chips formed on a wafer. This reduces the test time per chip and thus the unit price. In addition, in order to reduce the cost, an inexpensive cantilever type tester is used.

However, the tester of this type is provided with a small number of power supplies, which can be insufficient for the chips.

DETAILED DESCRIPTION

A semiconductor device according to an embodiment includes a semiconductor substrate. The semiconductor device has a plurality of LSI regions that are formed on the semiconductor substrate and are provided with a first power supply wiring layer including a first power supply wire. The semiconductor device has a first power supply terminal formed on the semiconductor substrate. The semiconductor device has a second power supply wiring layer including a second power supply wire that electrically connects the first power supply wire and the first power supply terminal, the second power supply wiring layer is formed in a dicing region between the LSI regions along a dicing line that separates the LSI regions and the dicing line region. A first barrier metal film is formed at least in the LSI regions at a boundary between the first power supply wire and the second power supply wire.

In the following, embodiments will be described with reference to the drawings.

(Embodiment 1)

Figure 1:
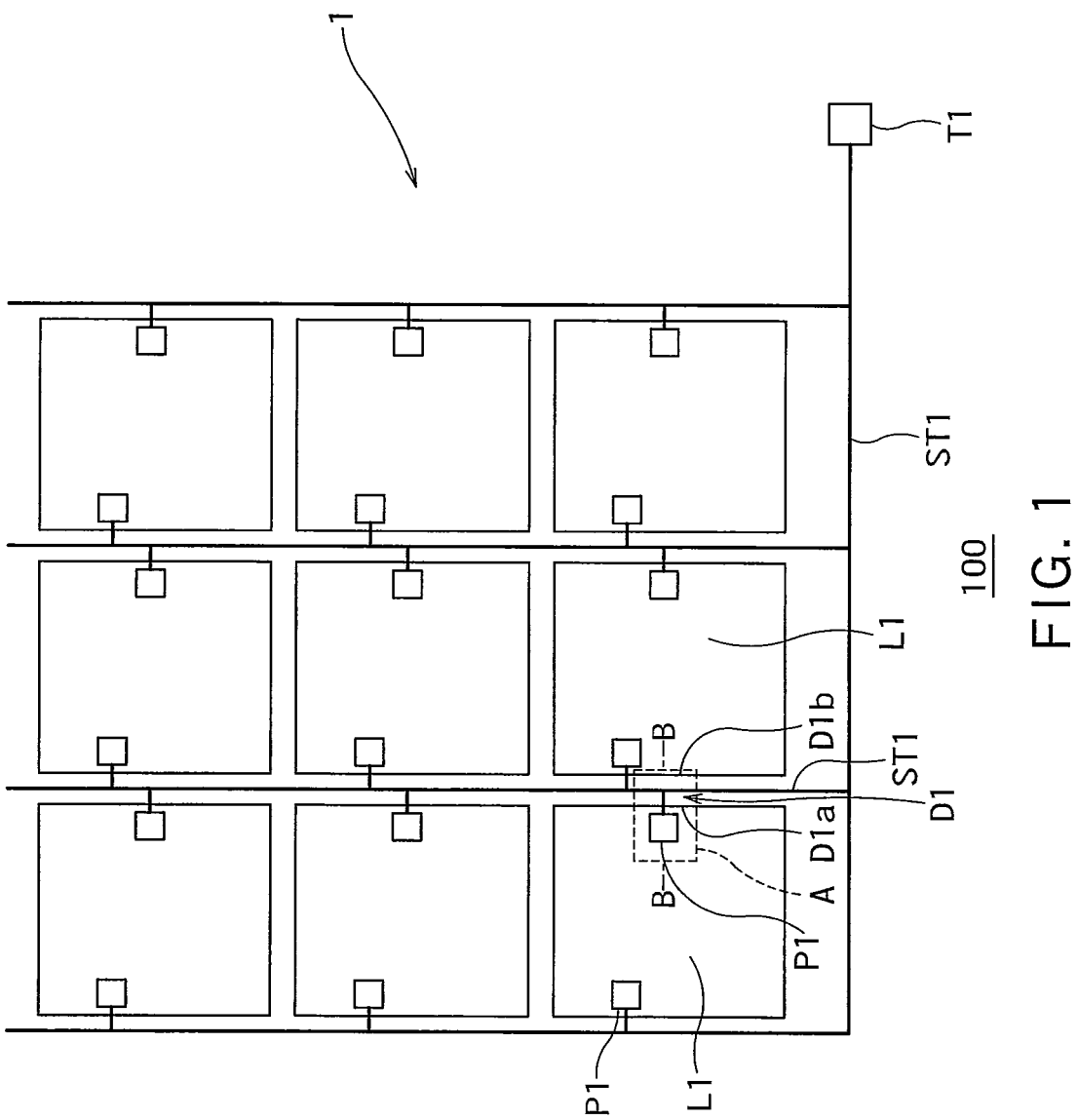
FIG. 1 is a plan view showing an exemplary configuration of a semiconductor device 100 according to an embodiment 1.
Figure 2:
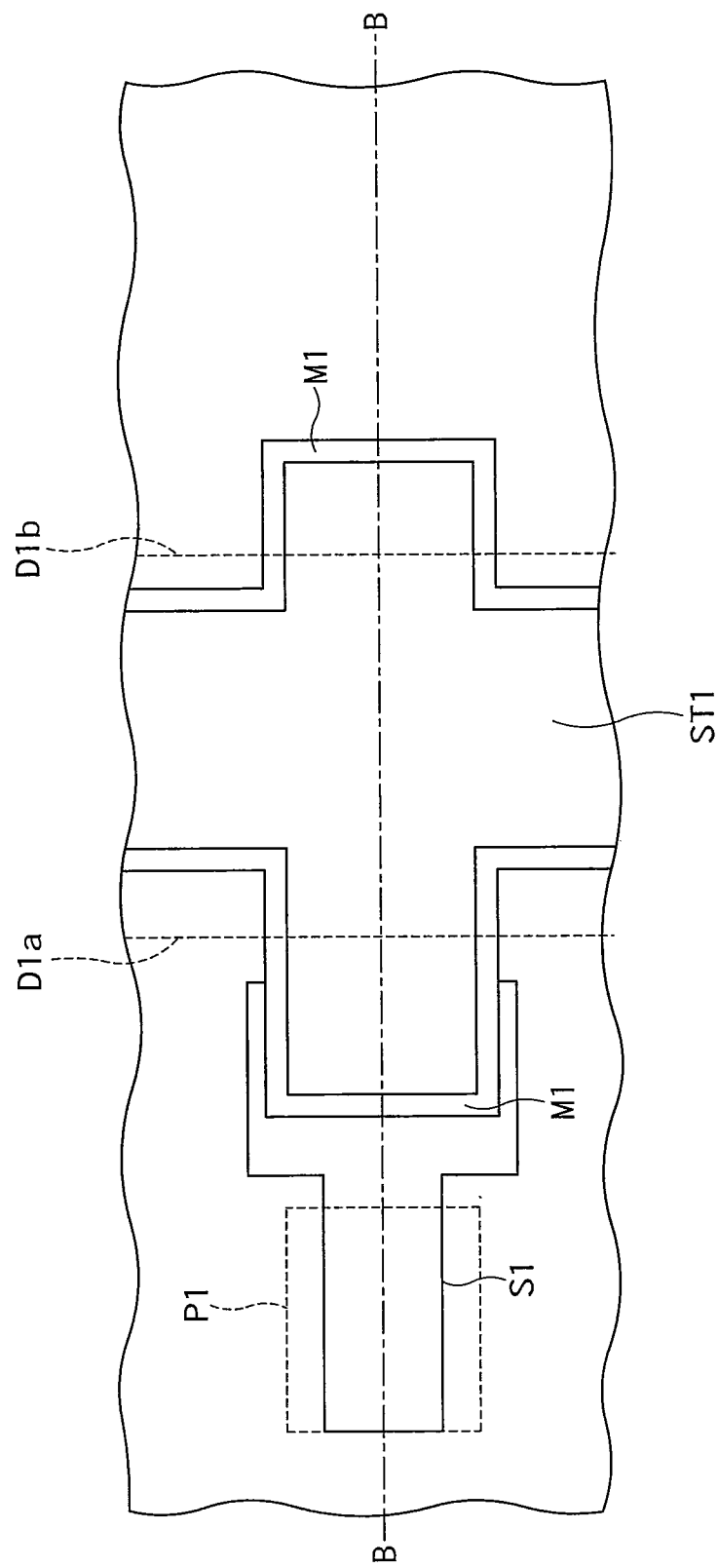
FIG. 2 is a top view of a region A of the semiconductor device 100 shown in FIG. 1.
Figure 3:
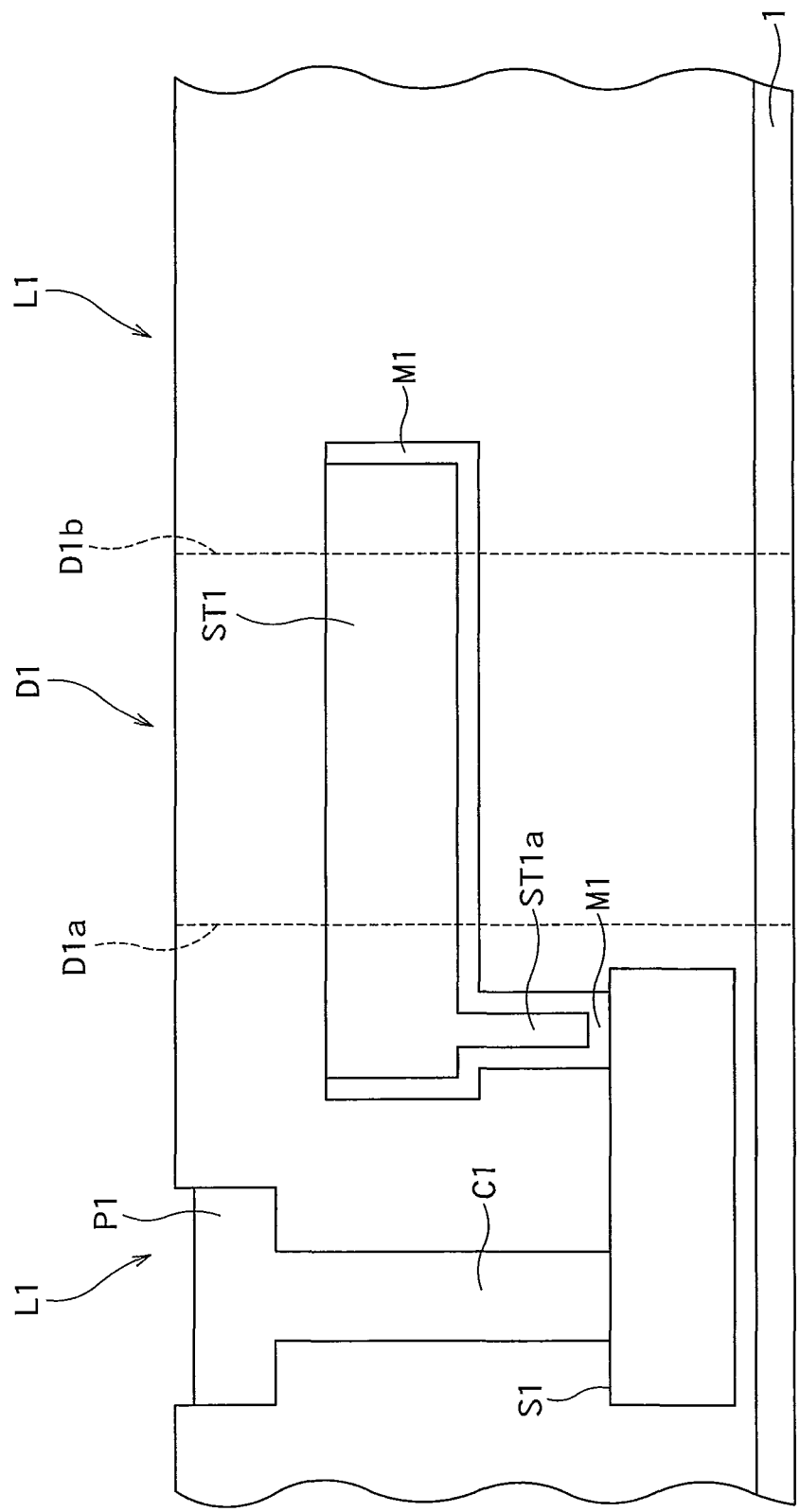
FIG. 3 is a cross-sectional view showing an exemplary cross section of the semiconductor device 100 taken along the line B-B in FIG. 2.

FIG. 1 is a plan view showing an exemplary configuration of a semiconductor device 100 according to an embodiment 1. FIG. 2 is a top view of a region A of the semiconductor device 100 shown in FIG. 1. FIG. 3 is a cross-sectional view showing an exemplary cross section of the semiconductor device 100 taken along the line B-B in FIG. 2.

As shown in FIGS. 1 to 3, the semiconductor device 100 includes a semiconductor substrate 1, a plurality of LSI regions L1, a first testing power supply terminal T1, and a dicing line region D1.

The semiconductor substrate 1 is a wafer of a semiconductor material, such as silicon.

The plurality of LSI regions L1 are formed on the semiconductor substrate 1 and include a power supply wiring layer including a plurality of power supply wires S1. The LSI region L1 further includes a wire bonding pad P1. The pad P1 is connected to a bonding wire (not shown) at a part exposed through an opening in an insulating film and a polyimide film (resin film) formed on the semiconductor substrate 1.

A first power supply wire S1 is electrically connected to the pad P1 via a contact wire C1.

The pad P1 and the contact wire C1 are made of a conductive material containing Al, for example.

The first testing power supply terminal T1 is formed on the semiconductor substrate 1, and a first testing voltage, which is supplied to the first power supply wire S1 in the LSI region L1 to test the LSI region L1, is applied to the first testing power supply terminal T1. The first testing power supply terminal T1 is disposed on an outer perimeter of the semiconductor substrate 1. Alternatively, the first testing power supply terminal T1 may be disposed in the dicing line region D1.

With such a configuration, the number of needles of the power supply of a cantilever type tester can be reduced, the flexibility of needle contact of a fixed card is improved, and the manufacturing cost of the LSI chip can be reduced.

The dicing line region D1 is formed on the semiconductor substrate 1 and positioned between adjacent LSI regions L1. The dicing line region D1 is cut away (removed) in dicing to cut the LSI regions L1 off.

The dicing line region D1 is formed along dicing lines D1a and D1b that separate the LSI regions L1 and the dicing line region from each other and includes a power supply wiring layer including a first testing power supply wire ST1 that electrically connects the first testing power supply terminal T1 and the first power supply wire S1 to each other.

In the example shown in FIG. 3, the first testing power supply wire ST1 and the first power supply wire S1 are formed in different layers in a multilayer structure. Thus, the first testing power supply wire ST1 is electrically connected to the first power supply wire S1 via a contact wire ST1a.

The first testing power supply wire ST1 and the contact wire ST1a are conductive layers containing Cu, for example. In particular, the first testing power supply wire ST1 is a conductive layer of Cu, an Al—Cu-based alloy, or an AlSi—Cu-based alloy.

A first barrier metal film M1 is deposited on a side surface and a bottom surface of the first testing power supply wire ST1 (contact wire ST1a) to prevent diffusion of a composition (Cu, for example) of the first testing power supply wire ST1. The barrier metal film M1 is made of TaN, for example.

The LSI region L1 is configured to include the first barrier metal film M1 disposed between the first power supply wire S1 and the first testing power supply wire ST1.

That is, after dicing, the LSI region L1 includes the remaining part of the cut first testing power supply wire ST1 and the first barrier metal film M1 disposed between the first testing power supply wire ST1 and the first power supply wire S1.

As a result, after dicing, even if the first testing power supply wire ST1 corrodes from the surface formed as a result of the dicing, the corrosion is not transferred to the first power supply wire S1 beyond the first barrier metal film M1. That is, corrosion of the first power supply wire S1 is prevented even after dicing.

The width of the dicing line region D1 between adjacent LSI regions L1 (between the dicing line D1a and the dicing line D1b) is smaller than twice the width of the first testing power supply wire ST1 extending between the adjacent LSI regions L1, for example. For example, the width of the dicing line region D1 approximately falls within a range from 30 μm to 250 μm.

Figure 4:
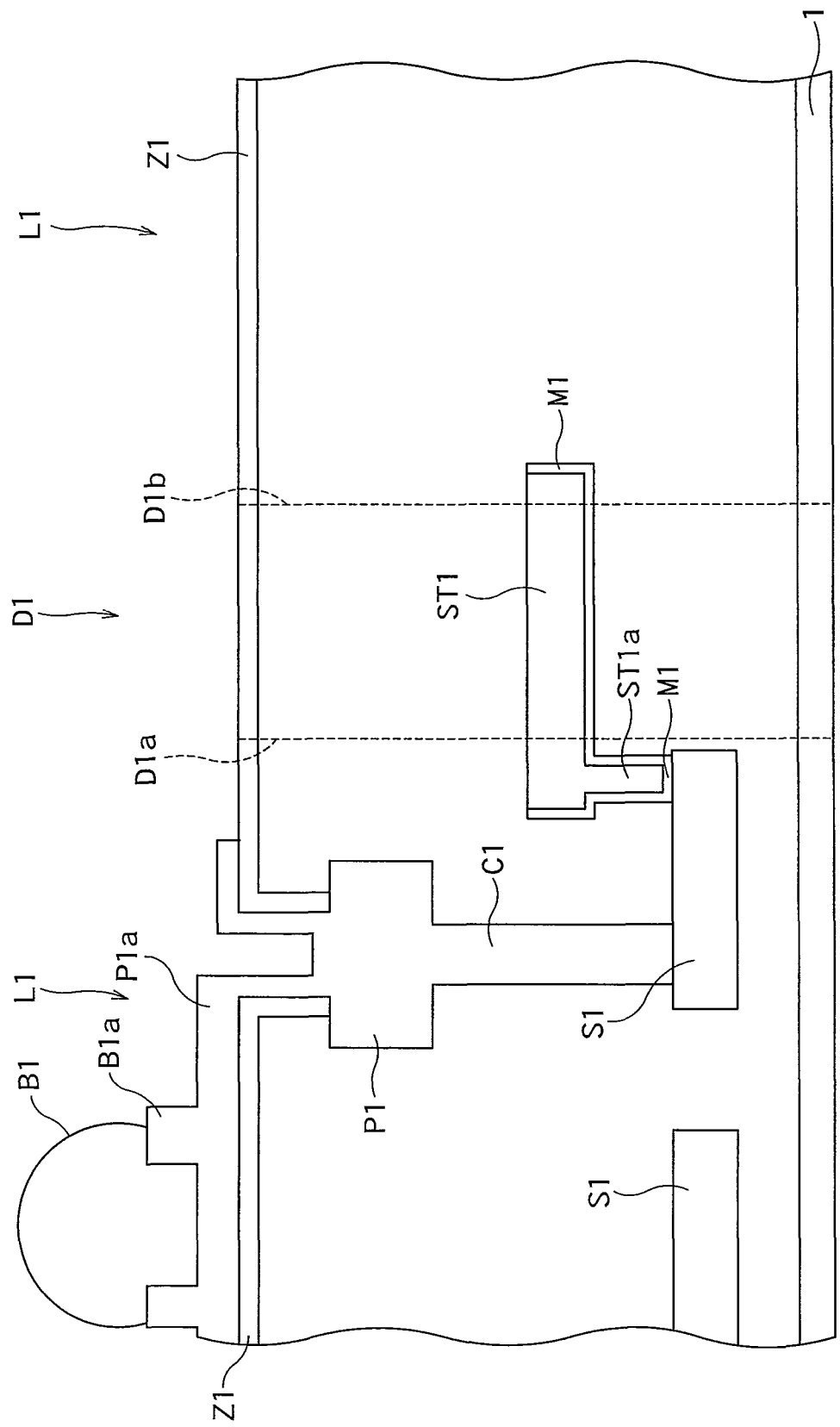
FIG. 4 is a cross-sectional view showing another exemplary cross section of the semiconductor device 100.

FIG. 4 is a cross-sectional view showing another exemplary cross section of the semiconductor device 100. Note that illustration of some parts including a ball electrode B1 and a connection electrode B1a, which are shown in FIG. 4, are omitted in FIG. 1.

As shown in FIG. 4, the semiconductor device 100 according to the modification further includes the ball electrode B1 for wafer level chip size package (WCSP) formed on the LSI region L1 with a polyimide film (resin film) Z1 interposed therebetween.

The LSI region L1 includes the pad P1 electrically connected to the ball electrode B1 via the connection electrode B1 and a via wire P1a. The first power supply wire S1 is electrically connected to the pad P1.

With such a configuration, in normal operation of the LSI chip after dicing, for example, a predetermined power supply voltage is applied to the first power supply wire S1 via the ball electrode B1, the connection electrode B1a, the via wire P1a, the pad P1 and the contact wire C1 and supplied to an internal circuit of the LSI chip.

As described above, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer.

As a result, the number of needles of the cantilever type tester can be reduced, the flexibility of needle contact of the fixed card is improved, and the manufacturing cost of the LSI chip can be reduced.

In addition, since the barrier metal is interposed between the testing power supply wire and the power supply wire of the LSI chip as described above, corrosion of the power supply wire of the LSI chip can be prevented even after dicing.

In addition, since the testing power supply wire is concentrated in the dicing line region, the number of chips per wafer can be increased.

As described above, with the semiconductor device according to the embodiment 1, the manufacturing cost of the LSI chip can be reduced.

(Embodiment 2)

In an embodiment 2, an exemplary configuration of a semiconductor device provided with two testing power supply wires in a dicing line region will be described.

Figure 5:
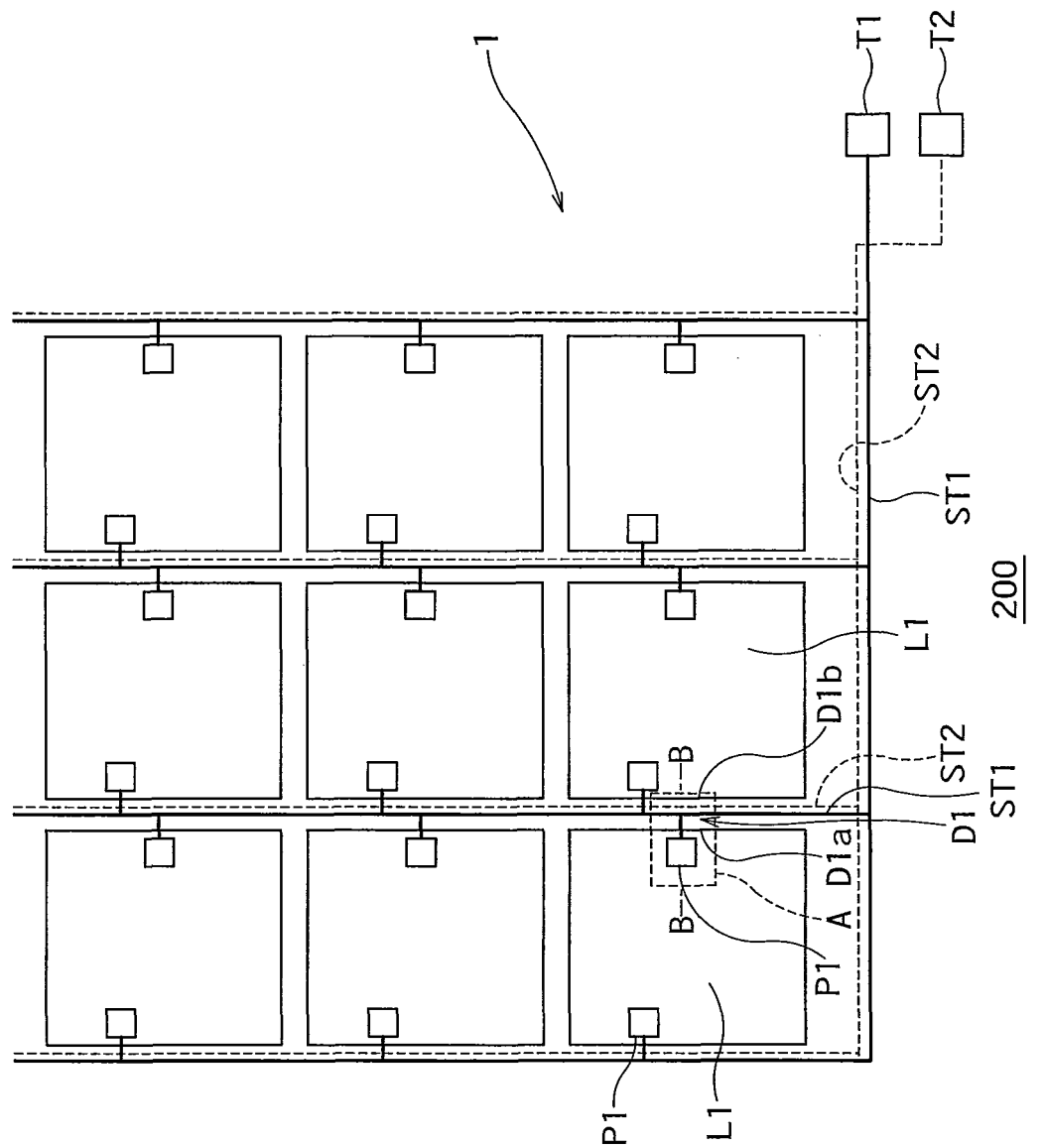
FIG. 5 is a plan view showing an exemplary configuration of a semiconductor device 200 according to the embodiment 2.
Figure 6:
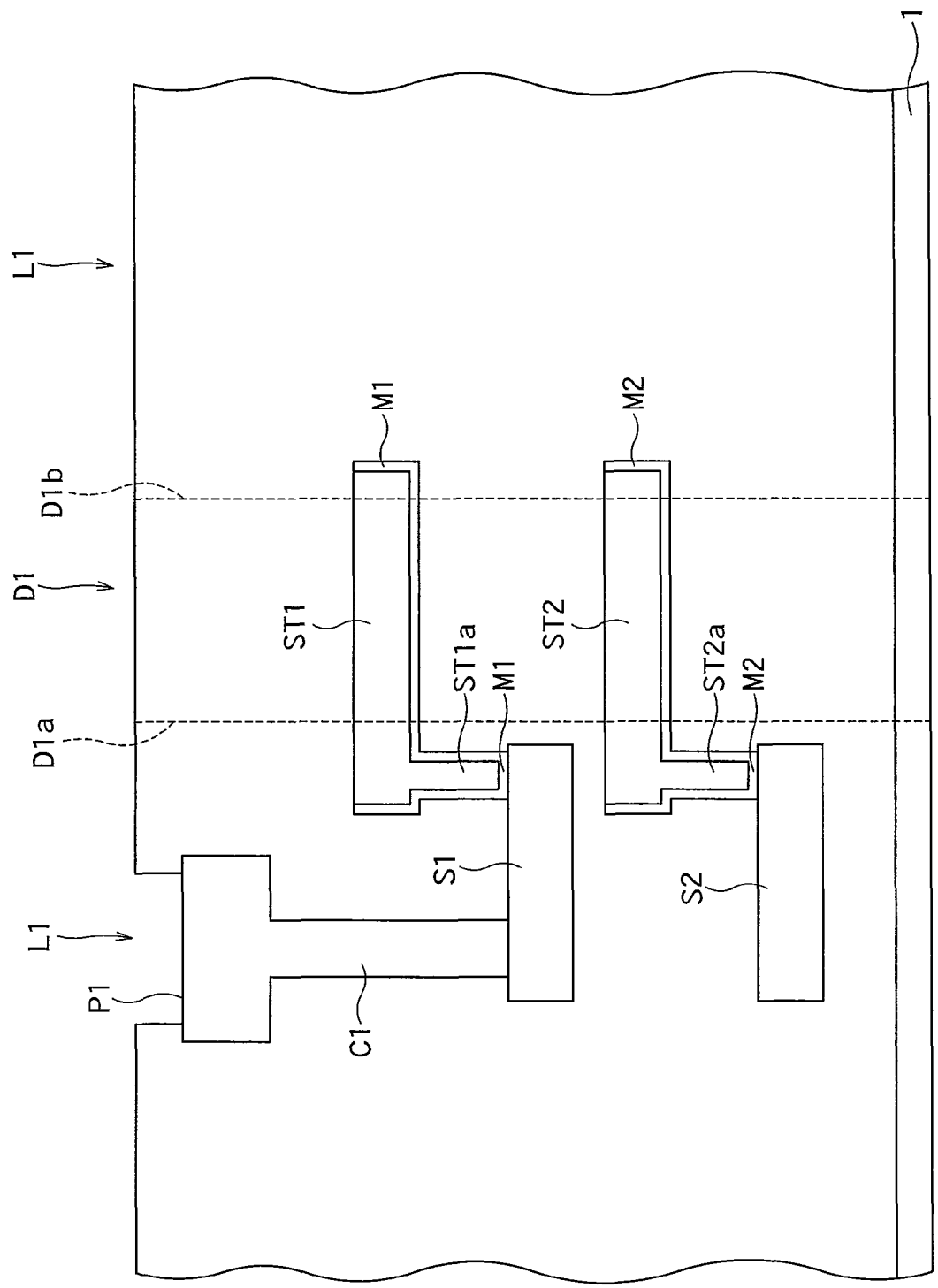
FIG. 6 is a cross-sectional view showing an exemplary cross section of the semiconductor device 200 taken along the line B-B in a region A in FIG. 5.

FIG. 5 is a plan view showing an exemplary configuration of a semiconductor device 200 according to the embodiment 2. FIG. 6 is a cross-sectional view showing an exemplary cross section of the semiconductor device 200 taken along the line B-B in a region A in FIG. 5. In FIGS. 5 and 6, the same reference numerals as those in FIGS. 1 to 4 denote the same parts as those in the embodiment 1.

As shown in FIGS. 5 and 6, the semiconductor device 200 according to the embodiment 2 includes a semiconductor substrate 1, a plurality of LSI regions L1, a first testing power supply terminal T1, a second testing power supply terminal T2, and a dicing line region D1.

That is, compared with the semiconductor device according to the embodiment 1, the semiconductor device 200 is additionally provided with the second testing power supply terminal T2. Furthermore, the semiconductor device 200 is additionally provided with a second power supply wire S2 formed along dicing lines D1a and D1b that separate the LSI regions L1 and the dicing line region D1 from each other.

The second testing power supply terminal T2 is formed on the semiconductor substrate 1, and a second testing voltage, which differs from the first testing voltage and is supplied to the second power supply wire S2 in the LSI regions L1 to test the LSI regions L1, is applied to the second testing power supply terminal T2. The second testing voltage differs from the ground voltage or the first testing voltage.

The second testing power supply terminal T2 is disposed on an outer perimeter of the semiconductor substrate 1. Alternatively, the second testing power supply terminal T2 may be disposed in the dicing line region D1.

With such a configuration, the number of needles of the power supply of a cantilever type tester can be reduced, the flexibility of needle contact of a fixed card is improved, and the manufacturing cost of the LSI chip can be reduced.

The dicing line region D1 further includes a second testing power supply wire ST2 positioned below the first testing power supply wire ST1 and electrically connects the second testing power supply terminal T2 and the second power supply wire S2 to each other. Alternatively, the second testing power supply wire ST2 may be disposed above the first testing power supply wire ST1.

In the example shown in FIG. 6, the second testing power supply wire ST2 and the second power supply wire S2 are formed in different layers in a multilayer structure, for example. Thus, the second testing power supply wire ST2 is electrically connected to the second power supply wire S2 via a contact wire ST2a.

The second testing power supply wire ST2 and the contact wire ST2a are conductive layers containing Cu, for example. In particular, the second testing power supply wire ST2 is a conductive layer of Cu or an AlSi—Cu-based alloy.

A second barrier metal film M2 is deposited on a side surface and a bottom surface of the second testing power supply wire ST2 (contact wire ST2a) to prevent diffusion of a composition (Cu, for example) of the second testing power supply wire ST2. The barrier metal film M2 is made of TaN, for example.

The LSI region L1 is configured to include the second barrier metal film M2 disposed between the second power supply wire S2 and the second testing power supply wire ST2.

That is, after dicing, the LSI region L1 includes the remaining part of the cut second testing power supply wire ST2 and the second barrier metal film M2 disposed between the second testing power supply wire ST2 and the second power supply wire S2.

As a result, after dicing, even if the second testing power supply wire ST2 corrodes from the surface formed as a result of the dicing, the corrosion is not transferred to the second power supply wire S2 beyond the second barrier metal film M2. That is, corrosion of the second power supply wire S2 is prevented even after dicing.

The width of the dicing line region D1 between adjacent LSI regions L1 (between the dicing line D1a and the dicing line D1b) is smaller than twice the width of the first and second testing power supply wires ST1 and ST2 extending between the adjacent LSI regions L1, for example. For example, the width of the dicing line region D1 approximately falls within a range from 30 µm to 250 µm.

As described above, since the first and second testing power supply wires ST1 and ST2 are vertically displaced from each other, the width of the dicing line region D1 can be reduced. As a result, the number of the levels of the voltage applied for testing can be increased while increasing the number of LSI chips per wafer.

Figure 7:
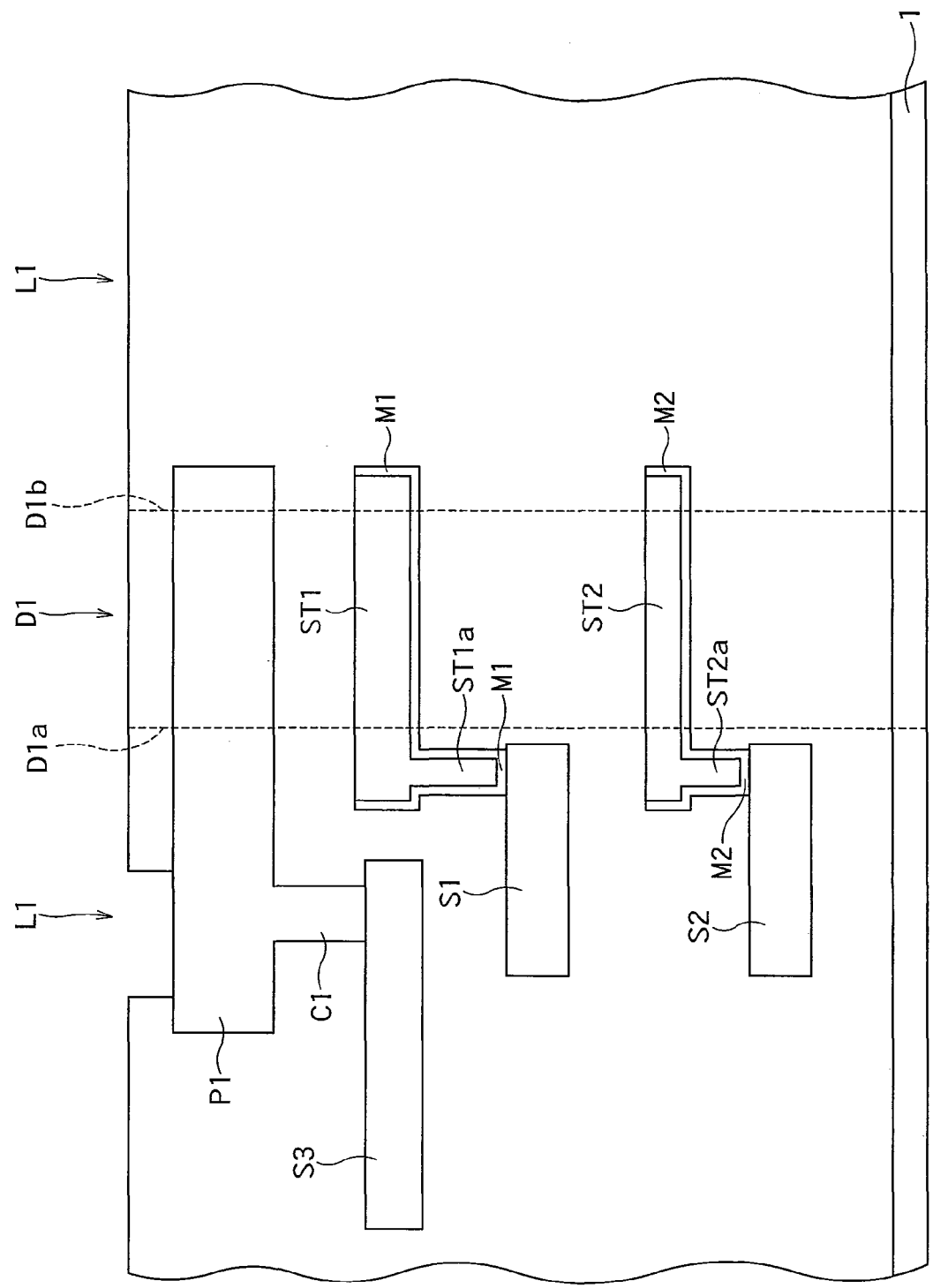
FIG. 7 is a cross-sectional view showing another exemplary cross section of the semiconductor device 200.

FIG. 7 is a cross-sectional view showing another exemplary cross section of the semiconductor device 200. In FIG. 7, the same reference numerals as those in FIG. 6 denote the same parts as those in FIG. 6.

As shown in FIG. 7, the pad P1 for wire bonding can extend into the dicing line region D1, and the extension can be electrically connected to a testing power supply wire (not shown) other than the first and second testing power supply wires ST1 and ST2. For example, the other testing power supply wire is formed on the semiconductor substrate 1 and connected to a testing terminal (not shown) to which a third testing voltage is applied to test the LSI region L1.

As described above, the semiconductor device has the third testing power supply wire in addition to the first and second testing power supply wires ST1 and ST2. As a result, the number of the levels of the voltage applied for testing can be further increased while increasing the number of LSI chips per wafer.

As described above, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer. As an alternative, as described above, the testing power supply terminal may be concentrated in the dicing line region D1.

As a result, the number of needles of the cantilever type tester can be reduced, the flexibility of needle contact of the fixed card is improved, and the manufacturing cost of the LSI chip can be reduced.

In addition, since the testing power supply wire is concentrated in the dicing line region, the number of chips per wafer can be increased.

As described above, with the semiconductor device according to the embodiment 2, the manufacturing cost of the LSI chip can be reduced, as in the embodiment 1.

(Embodiment 3)

In an embodiment 3, an exemplary configuration of another semiconductor device provided with two testing power supply wires in a dicing line region will be described.

Figure 8:
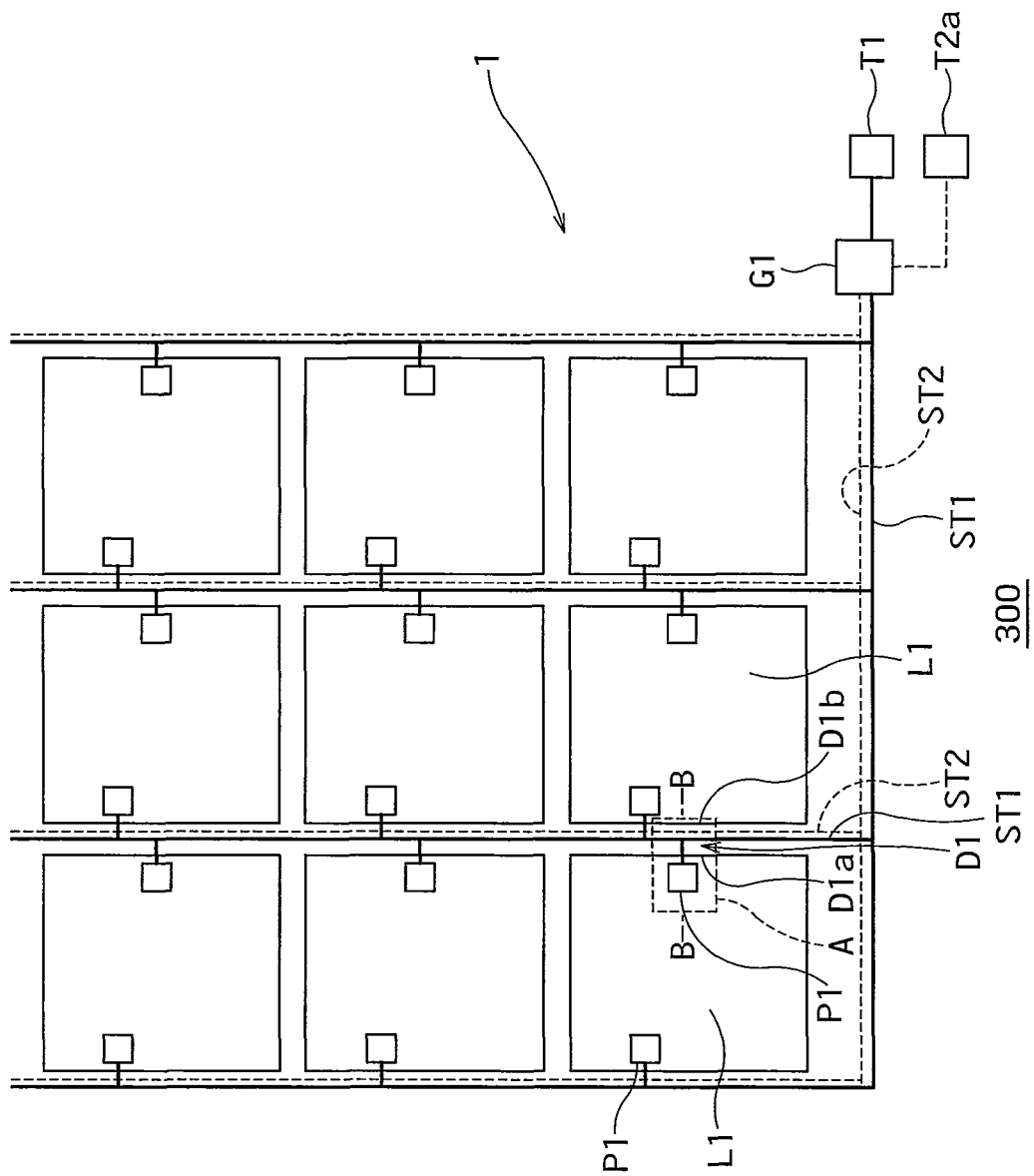
FIG. 8 is a plan view showing an exemplary configuration of a semiconductor device 300 according to the embodiment 3.
Figure 9:
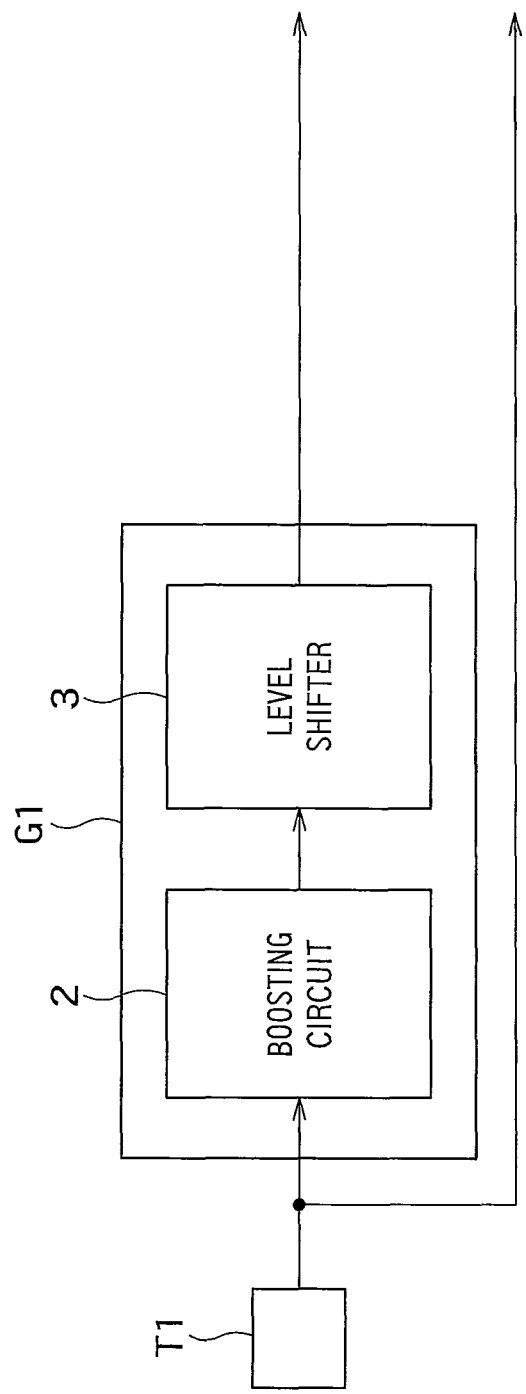
FIG. 9 is a diagram showing an exemplary configuration of a voltage generating circuit shown in FIG. 8.

FIG. 8 is a plan view showing an exemplary configuration of a semiconductor device 300 according to the embodiment 3. FIG. 9 is a diagram showing an exemplary configuration of a voltage generating circuit shown in FIG. 8. Along the line B-B in the region A in FIG. 8, the semiconductor device 300 can have the same cross section as those according to the embodiment 2 shown in FIGS. 6 and 7. In FIG. 8, the same reference numerals as those in FIG. 5 denote the same parts as those in the embodiment 2.

As shown in FIG. 8, compared with the semiconductor device according to the embodiment 2, the semiconductor device 300 is provided with a control terminal T2a instead of the second testing power supply terminal T2 and with a voltage generating circuit G1.

The voltage generating circuit G1 is formed on the semiconductor substrate 1 and generates and outputs a second testing voltage to be supplied to a second power supply wire S2 in an LSI region L1 for testing the LSI region L1 based on a first testing voltage applied to a first testing power supply terminal T1.

The control terminal T2a is formed on the semiconductor substrate 1, and a control signal for controlling the magnitude of the second testing voltage generated by the voltage generating circuit G1 is applied to the control terminal T2a. Note that the control terminal T2a may be omitted as required. In that case, the second testing voltage is constant.

As shown in FIG. 9, the voltage generating circuit G1 has a boosting circuit 2 that boosts the first testing voltage applied to the first testing power supply terminal T1 and outputs the boosted voltage, and a level shifter 3 that shifts the level of the output of the boosting circuit 2 and outputs the second testing voltage, for example.

The output of the level shifter 3 is controlled by the control signal.

As described above, since the first voltage generating circuit G1 generates the second testing voltage based on the first testing voltage, the second testing power supply terminal T2 can be omitted.

As a result, the number of needles of the power supply of a cantilever type tester can be reduced, the flexibility of needle contact of a fixed card is improved, and the manufacturing cost of the LSI chip can be reduced.

Figure 10:
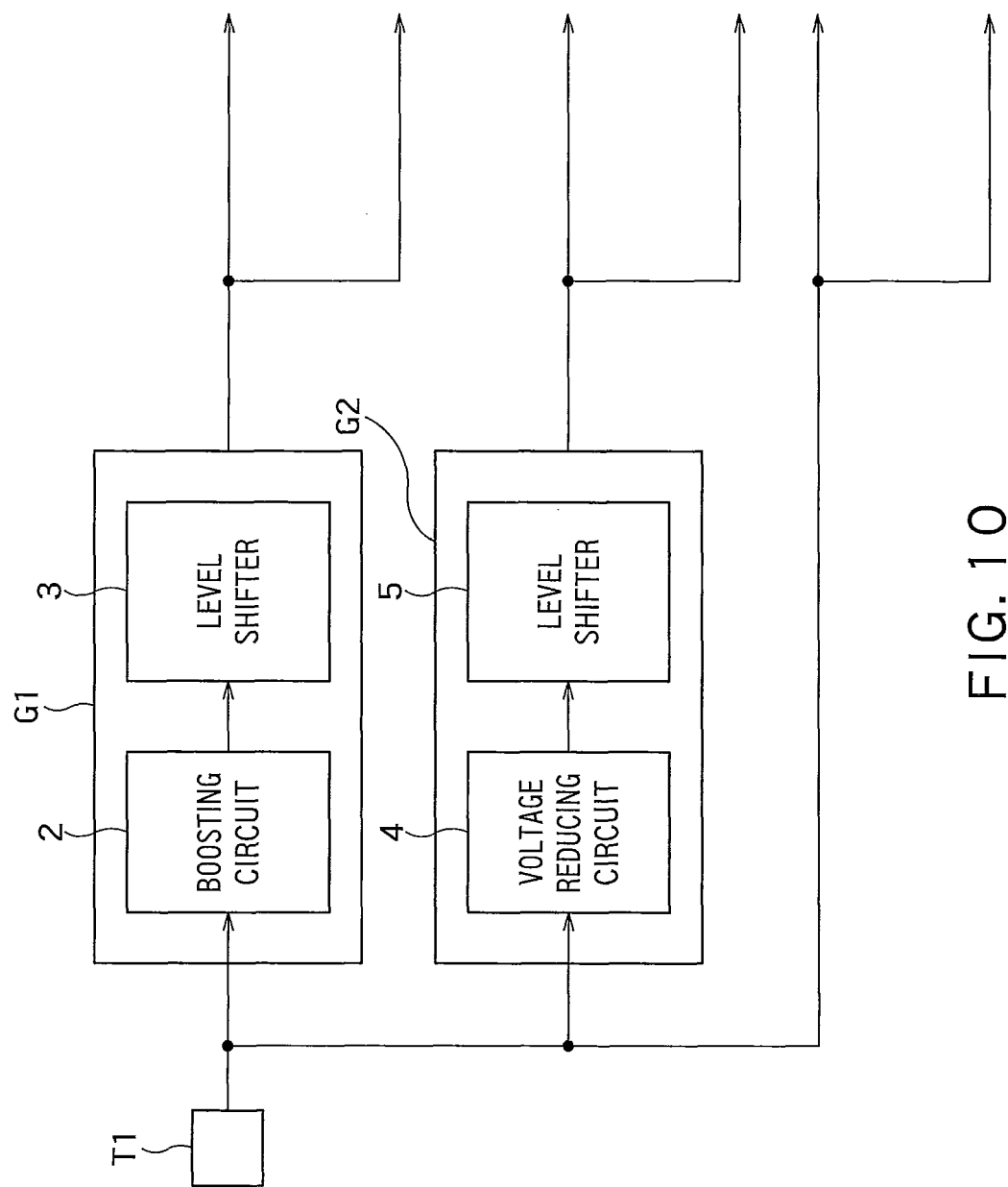
FIG. 10 is a diagram showing a modification of the configuration of the voltage generating circuit.

FIG. 10 is a diagram showing a modification of the configuration of the voltage generating circuit.

As shown in FIG. 10, the semiconductor device 300 can have a plurality of voltage generating circuits G1 and G2 depending on the required number of levels of the testing voltage.

The voltage generating circuit G1 has the same configuration as the configuration shown in FIG. 9.

The voltage generating circuit G2 is formed on the semiconductor substrate 1 and generates and outputs another testing voltage to be supplied to another power supply wire in the LSI region L1 for testing the LSI region L1 based on the first testing voltage applied to the first testing power supply terminal T1.

As shown in FIG. 10, the voltage generating circuit G2 has a voltage reducing circuit 4 that reduces the first testing voltage applied to the first testing power supply terminal T1 and outputs the reduced voltage, and a level shifter 5 that shifts the level of the output of the voltage reducing circuit 4 and outputs another testing voltage, for example.

The output of the level shifter 5 is controlled by the control signal.

As described above, the first and second voltage generating circuits G1 and G2 can generates several testing voltages based on the first testing voltage.

As a result, even if a plurality of testing voltages are required in testing, the number of needles of the cantilever type tester can be reduced, the flexibility of needle contact of the fixed card is improved, and the manufacturing cost of the LSI chip can be reduced.

As described above, with the semiconductor device according to the embodiment 3, the manufacturing cost of the LSI chip can be reduced, as in the embodiment 2.

Figure 11:
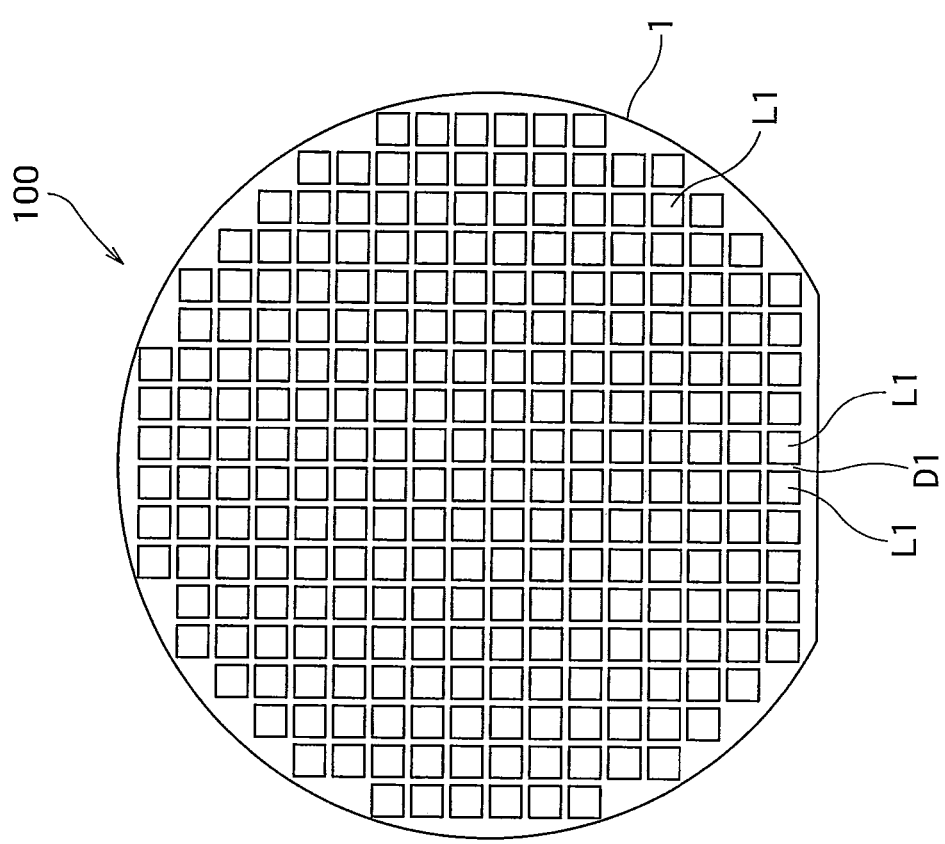
FIG. 11 is a diagram showing an exemplary configuration of the semiconductor device 100 the semiconductor substrate 1 of which is a wafer.

An exemplary configuration of the whole of the semiconductor devices according to the embodiments described above formed on a wafer will be described. FIG. 11 is a diagram showing an exemplary configuration of the semiconductor device 100 the semiconductor substrate 1 of which is a wafer. Although FIG. 11 shows the semiconductor device 100 according to the embodiment 1, the same description holds true for the semiconductor devices 200 and 300 according to the embodiments 2 and 3.

As shown in FIG. 11, a matrix of LSI regions L1 is formed on the wafer, which is the semiconductor substrate 1, and the dicing line region D1 extends between every adjacent LSI regions L1.

Although one or two testing power supply wires are disposed in the dicing line region in the embodiments described above, three or more testing power supply wires vertically displaced from each other may be disposed in the dicing line region.

(Embodiment 4)

In an embodiment 4, an exemplary configuration of another semiconductor device in which a plurality of pads for wire bonding are formed in an LSI region will be described.

Figure 12:
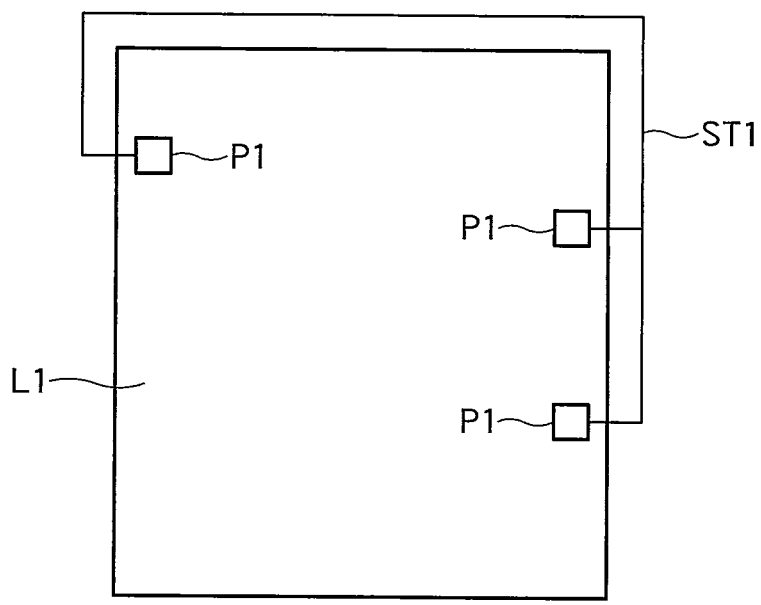
FIG. 12 is a plan view showing an exemplary configuration of the LSI region L1 of the semiconductor device 100 shown in FIG. 1.

FIG. 12 is a plan view showing an exemplary configuration of the LSI region L1 of the semiconductor device 100 shown in FIG. 1. In FIG. 12, the same reference numerals as those in FIG. 1 denote the same parts as those in the embodiment 1.

As shown in FIG. 12, the LSI region L1 includes a plurality of pads P1 for wire bonding. A common first power supply wire ST1 is electrically connected to the plurality of pads P1.

Therefore, the first testing voltage (the power supply voltage or the ground voltage, for example) can be applied to all the pads P1 in one LSI region L1 by applying the first testing voltage to one of the plurality of pads P1.

Alternatively, the second power supply wire ST2, instead of the first power supply wire ST1, may be electrically connected to all the plurality of pads P1 in one LSI region L1.

The remainder of the configuration is the same as those in the embodiments 1 and 2.

That is, as in the embodiments 1 and 2, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer.

As a result, as in the embodiments 1 and 2, the number of needles of the cantilever type tester can be reduced, the flexibility of needle contact of the fixed card is improved, and the manufacturing cost of the LSI chip can be reduced.

In addition, as in the embodiments 1 and 2, since the testing power supply wire is concentrated in the dicing line region, the number of chips per wafer can be increased.

As described above, with the semiconductor device according to the embodiment 4, the manufacturing cost of the LSI chip can be reduced, as in the embodiments 1 and 2.

(Embodiment 5)

In an embodiment 5, another exemplary configuration of the semiconductor device in which a plurality of pads for wire bonding are formed in an LSI region will be described.

Figure 13:
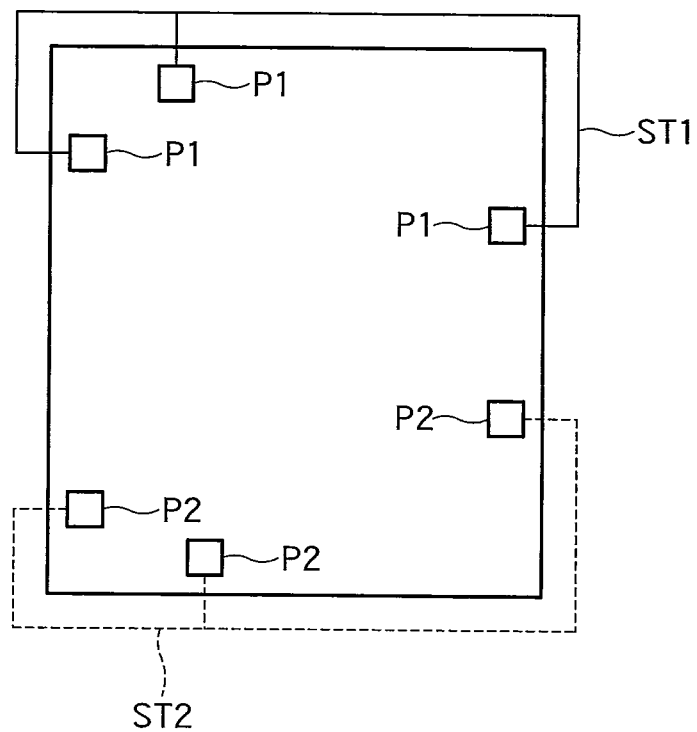
FIG. 13 is a plan view showing another exemplary configuration of the LSI region L1 of the semiconductor device 100 shown in FIG. 1.

FIG. 13 is a plan view showing another exemplary configuration of the LSI region L1 of the semiconductor device 100 shown in FIG. 1. In FIG. 13, the same reference numerals as those in FIGS. 1 and 5 denote the same parts as those in the embodiments 1 and 2.

As shown in FIG. 13, the LSI region L1 includes a plurality of first pads P1 for wire bonding and a plurality of second pads P2 for wire bonding.

A common first power supply wire ST1 is electrically connected to the plurality of first pads P1 of the pads P1 and P2.

A common second power supply wire ST2 is electrically connected to the plurality of second pads P2 of the pads P1 and P2.

Therefore, the first testing voltage (the power supply voltage or the ground voltage, for example) can be applied to all the plurality of first pads P1 in one LSI region L1 by applying the first testing voltage to one of the plurality of first pads P1.

Furthermore, the second testing voltage (the power supply voltage or the ground voltage, for example) can be applied to all the plurality of second pads P2 in one LSI region L1 by applying the second testing voltage to one of the plurality of second pads P2.

That is, as in the embodiments 1 and 2, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer.

As a result, as in the embodiments 1 and 2, the number of needles of the cantilever type tester can be reduced, the flexibility of needle contact of the fixed card is improved, and the manufacturing cost of the LSI chip can be reduced.

In addition, as in the embodiments 1 and 2, since the testing power supply wire is concentrated in the dicing line region, the number of chips per wafer can be increased.

As described above, with the semiconductor device according to the embodiment 5, the manufacturing cost of the LSI chip can be reduced, as in the embodiments 1 and 2.

(Embodiment 6)

In an embodiment 6, another exemplary configuration of the semiconductor device in which a plurality of pads for wire bonding are formed in an LSI region will be described.

Figure 14:
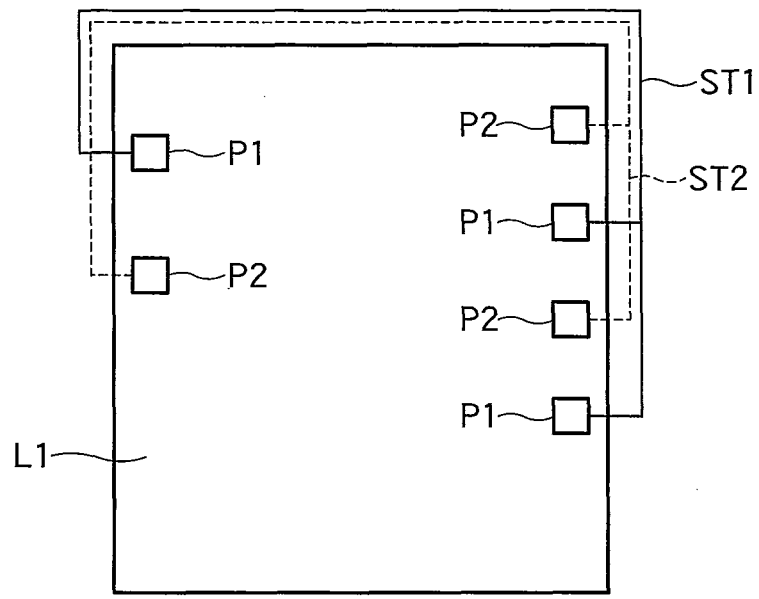
FIG. 14 is a plan view showing another exemplary configuration of the LSI region L1 of the semiconductor device 100 shown in FIG. 1.

FIG. 14 is a plan view showing another exemplary configuration of the LSI region L1 of the semiconductor device 100 shown in FIG. 1. In FIG. 14, the same reference numerals as those in FIGS. 1 and 5 denote the same parts as those in the embodiments 1 and 2.

As shown in FIG. 14, the LSI region L1 includes a plurality of first pads P1 for wire bonding and a plurality of second pads P2 for wire bonding.

A common first power supply wire ST1 is electrically connected to the plurality of first pads P1 of the pads P1 and P2.

A common second power supply wire ST2 is electrically connected to the plurality of second pads P2 of the pads P1 and P2.

In particular, in the embodiment 6, the second testing power supply wire ST2 is disposed below the first testing power supply wire ST1 in the periphery of the LSI region L1. Alternatively, the second testing power supply wire ST2 may be disposed above the first testing power supply wire ST1 in the periphery of the LSI region L1.

Therefore, the first testing voltage (the power supply voltage or the ground voltage, for example) can be applied to all the plurality of first pads P1 in one LSI region L1 by applying the first testing voltage to one of the plurality of first pads P1.

Furthermore, the second testing voltage (the power supply voltage or the ground voltage, for example) can be applied to all the plurality of second pads P2 in one LSI region L1 by applying the second testing voltage to one of the plurality of second pads P2.

The remainder of the configuration is the same as those in the embodiments 1 and 2.

That is, as in the embodiments 1 and 2, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer.

As a result, as in the embodiments 1 and 2, the number of needles of the cantilever type tester can be reduced, the flexibility of needle contact of the fixed card is improved, and the manufacturing cost of the LSI chip can be reduced.

In addition, as in the embodiments 1 and 2, since the testing power supply wire is concentrated in the dicing line region, the number of chips per wafer can be increased.

As described above, with the semiconductor device according to the embodiment 6, the manufacturing cost of the LSI chip can be reduced, as in the embodiments 1 and 2.

(Embodiment 7)

In an embodiment 7, another exemplary configuration of the semiconductor device in which a plurality of pads for wire bonding are formed in an LSI region will be described.

Figure 15:
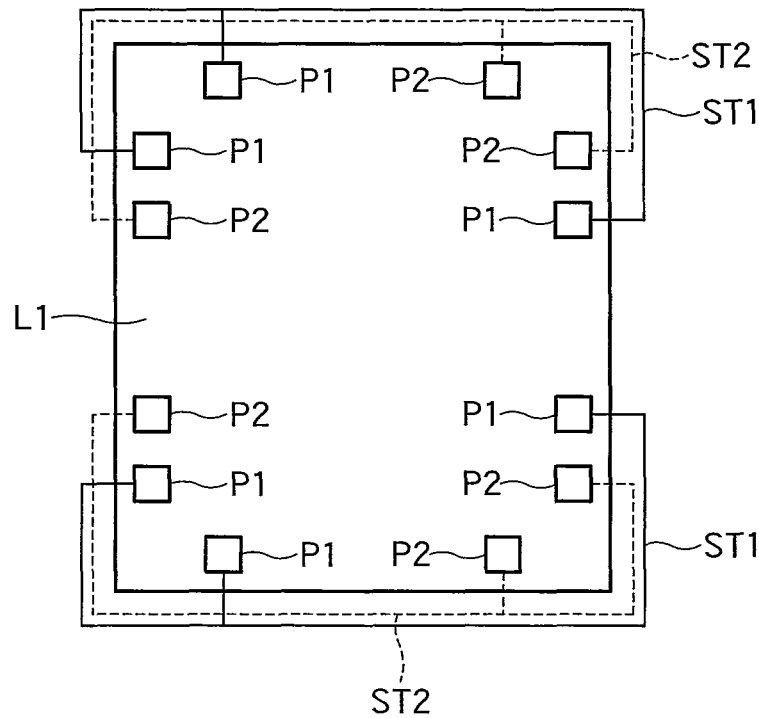
FIG. 15 is a plan view showing another exemplary configuration of the LSI region L1 of the semiconductor device 100 shown in FIG. 1.

FIG. 15 is a plan view showing another exemplary configuration of the LSI region L1 of the semiconductor device 100 shown in FIG. 1. In FIG. 15, the same reference numerals as those in FIGS. 1 and 5 denote the same parts as those in the embodiments 1 and 2.

As shown in FIG. 15, the LSI region L1 includes a plurality of first pads P1 for wire bonding and a plurality of second pads P2 for wire bonding.

A common first power supply wire ST1 is electrically connected to the plurality of first pads P1 of the pads P1 and P2.

A common second power supply wire ST2 is electrically connected to the plurality of second pads P2 of the pads P1 and P2.

In particular, in the embodiment 7, the first power supply wire ST1 and the second power supply wire ST2 are arranged along each side of the LSI region L1.

As in the embodiment 6, the second testing power supply wire ST2 is disposed below the first testing power supply wire ST1 in the periphery of the LSI region L1. Alternatively, the second testing power supply wire ST2 may be disposed above the first testing power supply wire ST1 in the periphery of the LSI region L1.

Therefore, the first testing voltage (the power supply voltage or the ground voltage, for example) can be applied to all the plurality of first pads P1 in one LSI region L1 by applying the first testing voltage to one of the plurality of first pads P1.

Furthermore, the second testing voltage (the power supply voltage or the ground voltage, for example) can be applied to all the plurality of second pads P2 in one LSI region L1 by applying the second testing voltage to one of the plurality of second pads P2.

That is, as in the embodiments 1 and 2, since the power supply wires for dicing test are formed in the region of the semiconductor substrate (wafer) to be cut in dicing, and the testing power supply wire for dicing test is connected to each LSI region, a single testing power supply terminal can suffice and be disposed on the outer perimeter of the wafer.

As a result, as in the embodiments 1 and 2, the number of needles of the cantilever type tester can be reduced, the flexibility of needle contact of the fixed card is improved, and the manufacturing cost of the LSI chip can be reduced.

In addition, as in the embodiments 1 and 2, since the testing power supply wire is concentrated in the dicing line region, the number of chips per wafer can be increased.

As described above, with the semiconductor device according to the embodiment 7, the manufacturing cost of the LSI chip can be reduced, as in the embodiments 1 and 2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor substrate;
   a plurality of LSI regions that are formed on the semiconductor substrate and are provided with a first power supply wiring layer including a first power supply wire;
   a first power supply terminal formed on the semiconductor substrate;
   a second power supply wiring layer including a second power supply wire that electrically connects the first power supply wire and the first power supply terminal, the second power supply wiring layer is formed in a dicing region between the LSI regions along a dicing line that separates the LSI regions and the dicing line region; and
   a second power supply terminal formed on the semiconductor substrate,
   wherein a first barrier metal film is formed at least in the LSI regions at a boundary between the first power supply wire and the second power supply wire,
   wherein the first power supply wiring layer further includes a third power supply wire,
   the second power supply wiring layer further includes a fourth power supply wire that is formed below the second power supply wire and electrically connects the third power supply wire and the second power supply terminal,
   wherein a second barrier metal film is formed at least in the LSI regions at a boundary between the third power supply wire and the fourth power supply wire.

2. The semiconductor device according to claim 1, further comprising:
   a voltage generating circuit that is formed on the semiconductor substrate, generates a voltage based on a voltage applied to the first power supply terminal and outputs the generated voltage to the fourth power supply wire.

3. The semiconductor device according to claim 1, wherein the first and second barrier metal films are made of TaN.

4. The semiconductor device according to claim 1, wherein a first testing voltage is applied to the first power supply terminal for a test, the first testing voltage being supplied to the first power supply wire through the third power supply wire.

5. The semiconductor device according to claim 1,
wherein each of the plurality of LSI regions further includes a wire bonding pad, and
wherein the first power supply wire is electrically connected to the wire bonding pad.

6. The semiconductor device according to claim 1,
wherein each of the plurality of LSI regions further includes a plurality of wire bonding pads, and
wherein the first power supply wire is electrically connected to the plurality of wire bonding pads commonly.

7. The semiconductor device according to claim 1,
wherein each of the plurality of LSI regions further includes a plurality of wire bonding pads, and
wherein the third power supply wire is electrically connected to the plurality of wire bonding pads commonly.

8. The semiconductor device according to claim 1,
wherein each of the plurality of LSI regions further includes a plurality of wire bonding pads,
wherein the first power supply wire is electrically connected to a plurality of first wire bonding pads of the plurality of wire bonding pads, and
wherein the second power supply wire is electrically connected to a plurality of second wire bonding pads of the plurality of wire bonding pads.

9. The semiconductor device according to claim 1, wherein a width of the dicing line region between adjacent LSI regions is smaller than twice the width of the first and second power supply wires extending between the adjacent LSI regions.

* * * * *